(12) United States Patent
Floch et al.

(10) Patent No.: US 9,705,667 B2
(45) Date of Patent: Jul. 11, 2017

(54) TRACKING OF SIGNALS WITH AT LEAST ONE SUBCARRIER

(71) Applicant: Airbus DS GmbH, Taufkirchen (DE)

(72) Inventors: Jean-Jacques Floch, Munich (DE); Francis Soualle, Munich (DE); Jan Wendel, Munich (DE); Frank Schubert, Munich (DE)

(73) Assignee: Airbus DS GmbH, Taufkirchen (DE)

( * ) Notice: Subject to any disclaimer, the term of this patent is extended or adjusted under 35 U.S.C. 154(b) by 0 days.

(21) Appl. No.: 15/265,569

(22) Filed: Sep. 14, 2016

(65) Prior Publication Data
US 2017/0078083 A1    Mar. 16, 2017

(30) Foreign Application Priority Data

Sep. 14, 2015 (EP) .................................... 15002670

(51) Int. Cl.
*H04L 7/033* (2006.01)
*H04L 27/152* (2006.01)
(Continued)

(52) U.S. Cl.
CPC ................ *H04L 7/033* (2013.01); *H03L 7/02* (2013.01); *H03L 7/07* (2013.01); *H03L 7/22* (2013.01); *H04L 27/152* (2013.01)

(58) Field of Classification Search
CPC ..... H03L 7/02; H03L 7/07; H03L 7/22; H04L 7/033; H04L 7/041; H04L 7/042; H04L 27/0044; H04L 27/0053; H04L 27/0071; H04L 27/152; H04L 27/2271; H04L 27/2272; H04L 27/2275
(Continued)

(56) References Cited

U.S. PATENT DOCUMENTS

| | | | |
|---|---|---|---|
| 7,995,683 B2 * | 8/2011 | Yuan ....................... | G01S 19/30 375/343 |
| 2005/0270997 A1 * | 12/2005 | Julien ..................... | G01S 19/30 370/315 |

(Continued)

FOREIGN PATENT DOCUMENTS

| | | |
|---|---|---|
| CN | 101826889 | 9/2010 |
| EP | 2796896 | 10/2014 |

OTHER PUBLICATIONS

"A Triple-Loop Tracking Method for High-Order BOC-Modulated Signals" Wu H B et al., Jan. 1, 2014.
(Continued)

*Primary Examiner* — Young T Tse
(74) *Attorney, Agent, or Firm* — Greer, Burns & Crain Ltd.

(57) ABSTRACT

A system for tracking a received signal with a subcarrier, the received signal representing a carrier signal modulated with a code signal and with a subcarrier signal. The system comprises independent and cooperatively operating loops: a phase lock loop tracking the carrier signal, a subcarrier lock loop tracking the subcarrier signal, and a delay lock loop tracking the code signal. The subcarrier lock loop comprises a first controllable oscillator and a first early-minus-late discriminator generating a control signal for the first controllable oscillator. The delay lock loop comprising a second controllable oscillator and a second arctan discriminator generating a control signal for the second controllable oscillator.

16 Claims, 8 Drawing Sheets (51) Int. Cl.
*H03L 7/02* (2006.01)
*H03L 7/07* (2006.01)
*H03L 7/22* (2006.01)

(58) Field of Classification Search
USPC ....... 375/134, 137, 145, 149, 324, 326, 327, 375/340, 343, 354, 376; 370/350, 516, 370/517; 455/205, 208–210, 214
See application file for complete search history.

(56) References Cited

U.S. PATENT DOCUMENTS

| | | |
|---|---|---|
| 2006/0097915 A1 | 5/2006 | Martin et al. |
| 2007/0201537 A1* | 8/2007 | De Wilde ............... G01S 19/30 375/147 |
| 2010/0104046 A1 | 4/2010 | Hodgart et al. |
| 2010/0135364 A1* | 6/2010 | Hodgart ................ G01S 19/24 375/147 |
| 2012/0050103 A1* | 3/2012 | Revol .................... G01S 19/21 342/357.68 |

OTHER PUBLICATIONS

"Double Phase Estimator: Towards a New Perception of the Subcarrier Component", Daniele Borio, May 1, 2015.
European Search Report, Feb. 26, 2016 priority document.

\* cited by examiner

TRACKING OF SIGNALS WITH AT LEAST ONE SUBCARRIER

CROSS-REFERENCES TO RELATED APPLICATIONS

This application claims the benefit of the European patent application No. 15 002 670.6 filed on Sep. 14, 2015, the entire disclosures of which are incorporated herein by way of reference.

BACKGROUND OF THE INVENTION

The invention relates to the tracking of signals with at least one subcarrier such as Binary Offset Carrier (BOC) modulated signals. Particularly, the present invention relates to tracking of BOC (modulated) signals of a GNSS (Global Navigation Satellite System).

In next generation GNSSs, BOC modulations and multiplexed BOC (MBOC) modulations will be used. Examples are the Galileo E1 open signal, a CBOC (6,1,1/11) signal (Composite BOC using a sine subcarrier), the Galileo PRS (Public Regulated Service) signals on E1 and E6, a BOCc (15,2.5) signal and a BOCc(10,5) signal, respectively, and the GPS (Global Positioning System) M-code, a BOC(10,5) signal. In more general terms, the above mentioned signals may be referred to as subcarrier modulated signals. Such subcarrier modulated signals comprise a carrier signal, which is modulated with a pseudo random noise (PRN) code, and which is additionally modulated with one or more subcarriers. Additionally, navigation message data may or may not be modulated onto the carrier signal.

Figure 1:
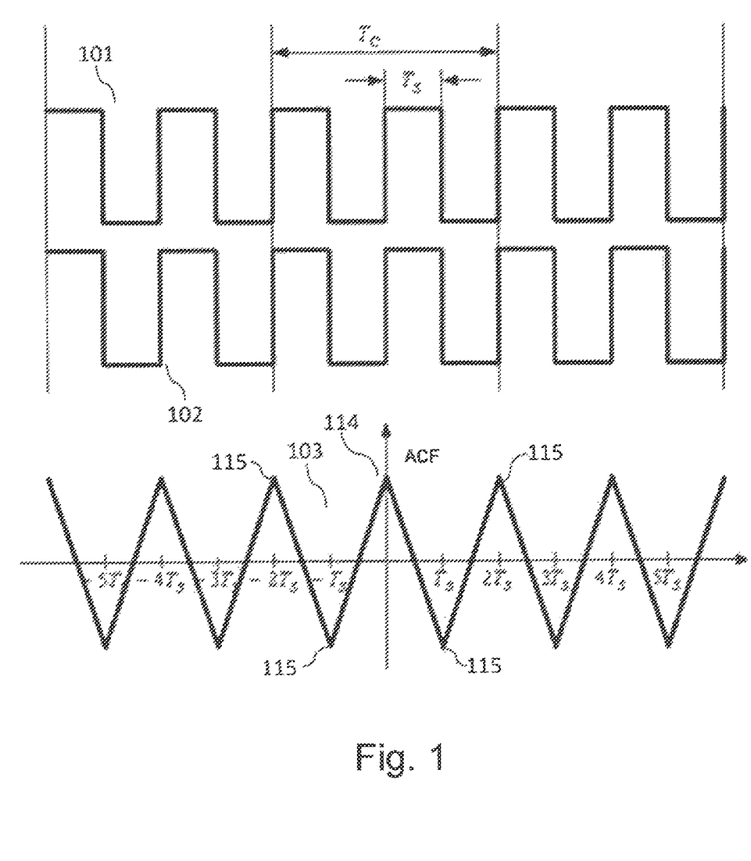
FIG. 1 shows an example subcarrier signal used for modulating a carrier signal and its saw-tooth like autocorrelation function.
Figure 2:
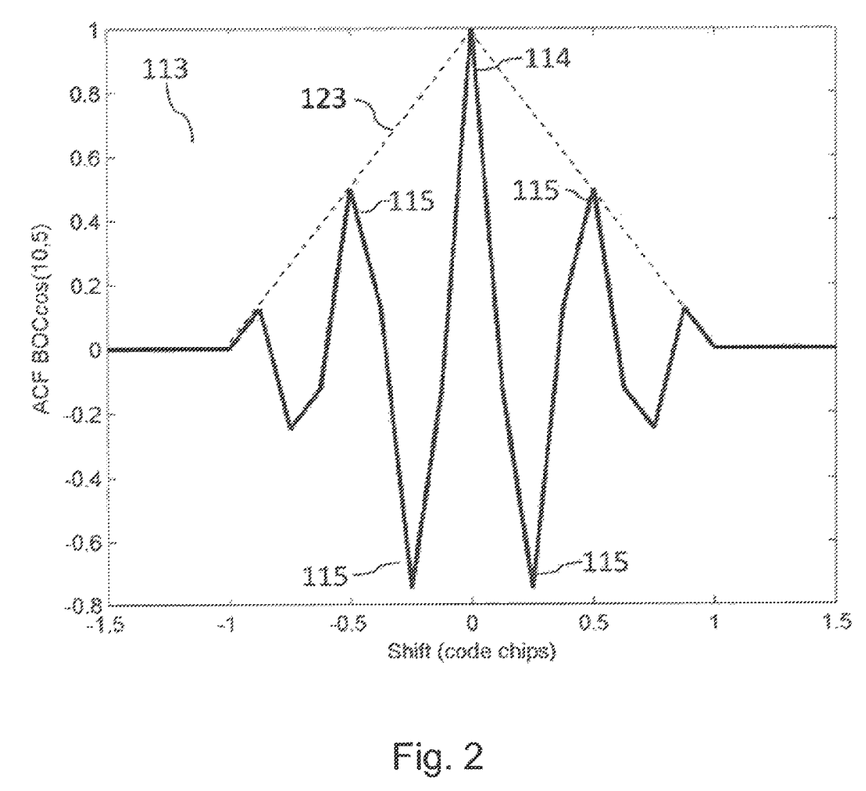
FIG. 2 shows an autocorrelation function of an example subcarrier modulated signal.

A BOC modulated signal without the subcarrier modulation corresponds to a Binary Phase Shift Keying (BPSK) signal used like it is used for GPS SPS (Standard Positioning Service), which has a triangular autocorrelation function. FIG. 1 shows an example subcarrier signal 101, 102 having a subcarrier symbol duration $$T_s = \frac{1}{2f_s},$$

wherein $f_s$ is the subcarrier rate. FIG. 1 also illustrates the symbol duration $$T_c = \frac{1}{f_c}$$

of a symbol of the PRN code (wherein $f_c$ is the code rate), yet the PRN code signal itself is not shown in this figure. In the illustrated example, the subcarrier rate $f_s$ is twice as high as the code rate $f_c$ and the resulting BOC signal is referred to as a BOC(2m,m) signal (based on the notation BOC(m,n) where the respective frequencies are given by $f_s$=m·1.023 MHz, $f_c$=n·1.023 MHz). The code rate $f_c$ may also be referred to as the chip rate and a symbol of the PRN code (having a code symbol duration $T_c$) may be referred to as a chip. The subcarrier 101, 102 itself has a saw-tooth like autocorrelation function 103 as shown in FIG. 1 for a BOC(10,5) signal. The autocorrelation function 113 of a BOC signal is approximately given by the multiplication of a triangular PRN-code autocorrelation function 123 with the subcarrier autocorrelation function 103. Therefore, this autocorrelation function 113 has multiple peaks as shown in FIG. 2 for a BOC cos(10,5) signal.

The autocorrelation function 113 which exhibits multiple peaks has advantages and disadvantages: The main peak 114 of the autocorrelation function 113 is significantly narrower than the single peak of the autocorrelation function 123 of the corresponding BPSK signal. This offers the potential for an increased tracking accuracy, i.e., less code jitter, and a better multipath performance. In particular, this may be used for determining (i.e., for tracking) a transmission delay of the BOC signals with increased accuracy. The transmission delay of the BOC signal may then be used for determining the position of a GNSS receiver.

On the other hand, a tracking loop may lock to a side peak 115 instead of the main peak 114. If the locking to a side peak 115 is not recognized and corrected, systematic errors in the pseudo-range measurements occur, which in turn lead to position errors. For a BOC cos(15,2.5) (also referred to as BOCc(15,2.5)) modulated signal, i.e., a BOC modulated signal using a subcarrier which is phase shifted by 90 degrees with respect to the PRN code, a false lock to the first side peak 115 leads to a pseudo-range error of approximately 10 meter, and for a BOC cos(10,5) modulated signal, this error is approximately 15 meters. However, it is also possible that a tracking loop locks to a side peak 115 further away from the main peak 114, such that the resulting error is a multiple of the error for a false lock to the first side peak 115.

Different techniques have been proposed for tracking these signals, e.g., bump jumping, a Sidelobe Cancellation Method, BPSK-like techniques, a Multiple Gate Delay discriminator, and a Double Estimator technique to name a few.

The US patent application US 2010/0104046 A1 describes the Double Estimator technique, which consists of three independent but cooperative loops for carrier, subcarrier, and code. The Double Estimator provides two independent delay estimates, one from code tracking, and one from subcarrier tracking. The code tracking delay estimate $\tau$ is less accurate, while the subcarrier tracking delay estimate $\tau^*$ is ambiguous with the subcarrier chip duration $T_s$. The final delay estimate $\tau_{final}$ is then calculated by resolving the subcarrier delay ambiguity using the less accurate code delay estimate, for example by rounding the difference of code delay and subcarrier delay, both divided by the subcarrier chip duration, to the nearest integer and adding the result multiplied by the subcarrier chip duration to the subcarrier delay:

$$\tau_{final} = \tau^* + \text{round}\left(\frac{\tau - \tau^*}{T_S}\right) \cdot T_S$$

Another approach is the Double Phase Estimator, described in the publication "Double Phase Estimator Towards a New Perception of the Subcarrier Component", D. Borio, InsideGNSS, May/June 2015, http://www.insidegnss.com, available under http://www.insidegnss.com/auto/mayjune15-WP.pdf. The difference between the Double Estimator and the Double Phase Estimator is that the Double Phase Estimator uses an arctan discriminator like it is used in PLLs (Phase Lock Loops) for subcarrier tracking.

A further approach is described in the European patent application EP13290093.7. The tracking method disclosed in this application employs two independent but cooperative loops: One loop is used for carrier tracking, which is similar to a conventional PLL or FLL (Frequency Lock Loop). The other loop is performing a subcarrier tracking using an early-minus-late discriminator. Additionally, the subcarrier loop NCO (Numerical Controlled Oscillator) produces two replica signals composed of a prompt subcarrier, multiplied in one case with an early code replica, in the other case multiplied with a late code replica. These two replicas are correlated with the incoming signal, and the two correlation results are provided to an early-minus-late discriminator for detection of false locks to a side-peak of the subcarrier lock loop.

SUMMARY OF THE INVENTION

It is an object of the present invention to propose an alternative tracking of signals with at least one subcarrier such as BOC and MBOC signals.

This invention presents an alternative tracking algorithm for BOC and MBOC signals, fully exploiting the subcarrier accuracy and allowing for reliable, fast and robust detection and correction of false locks to side peaks. The invention exploits the nature of early-minus-late (EML) and arctan discriminators. Hereby, the expression EML discriminator is to be understood in a generalized sense, i.e., possible implementations are dot-product-power, early-minus-late-power, early-minus-late-envelope, but also double-delta, to name a few. All of them can be implemented as coherent or non-coherent discriminators. Typically, these discriminators are used in the DLL (Delay Lock Loop) of a GNSS receiver. Additionally, the expression arctan discriminator is to be understood in a generalized sense as well, possible implementations are Costas, IQ-product, decision-directed Q, Q-over-I, and two-quadrant arctangent discriminators, to name a few, but also FLL discriminators. Typically, these discriminators are used in a PLL, or in the latter case a FLL, of a GNSS receiver.

A first embodiment of the invention, which is based on the Double Estimator technique or Double Phase Estimator technique, relates to a system for tracking of a received signal s(t) with at least one subcarrier, wherein the received signal represents a carrier signal modulated with a code signal and modulated with a subcarrier signal, wherein the system comprises the following independent and cooperatively operating loops:

A phase lock loop for tracking the carrier signal.

A subcarrier lock loop for tracking the subcarrier signal, which comprises a controllable oscillator and an early-minus-late discriminator for generating a control signal for the controllable oscillator, wherein the early-minus-late discriminator generates the control signal based on a difference between correlation results with a replica of an advanced subcarrier signal E and a replica of a delayed subcarrier signal L. Alternatively, the subcarrier lock loop comprises a controllable oscillator and an arctan discriminator for generating a control signal for the controllable oscillator, wherein the arctan discriminator generates the control signal based on correlation results with a cosine subcarrier replica and a sine subcarrier replica.

A delay lock loop for tracking the code signal, which comprises a controllable oscillator and an arctan discriminator for generating a control signal for the controllable oscillator, wherein the arctan discriminator generates the control signal based on correlation results with a replica of a prompt subcarrier signal P multiplied with a prompt subcarrier signal and the replica of the prompt subcarrier signal P multiplied with the difference of an advanced and a delayed code signal, E-L.

A second embodiment of the invention, which is based on the approach described in the European patent application EP13290093.7, relates to a system for tracking of a received signal s(t) with at least one subcarrier, wherein the received signal represents a carrier signal modulated with a code signal and modulated with a subcarrier signal, wherein the system comprises the following independent and cooperatively operating loops:

A phase lock loop for tracking the carrier signal.

A subcarrier lock loop for tracking the subcarrier signal, which comprises a controllable oscillator and an early-minus-late discriminator for generating a control signal for the controllable oscillator, wherein the early-minus-late discriminator generates the control signal based on a difference between correlation results with a replica composed of an early subcarrier signal and a prompt code signal EP and a replica composed of a late subcarrier signal and a prompt code signal LP. Alternatively, the subcarrier lock loop comprises a controllable oscillator and an arctan discriminator for generating a control signal for the controllable oscillator, wherein the arctan discriminator generates the control signal based on the correlation results with a replica composed of a sine subcarrier signal and a prompt code signal SP and a replica composed of a cosine subcarrier signal and a prompt code signal CP.

A detection path for detecting a delay estimate of the code signal, which comprises an arctan discriminator and a delay estimate detector, wherein the arctan discriminator generates an input signal for the delay estimate detector based on the correlation results with a replica composed of a prompt subcarrier signal and the difference of an early and a late code signal P(E-L) and a replica composed of a prompt subcarrier signal and a prompt code signal PP.

At least one of the early-minus-late discriminators may be implemented as a dot-product-power discriminator, an early-minus-late-power discriminator, an early-minus-late-envelope discriminator, or a double-delta discriminator.

At least one of the early-minus-late discriminators may be implemented as a coherent or a non-coherent discriminator.

At least one of the arctan discriminators may be implemented as a Costas discriminator, an IQ-product discriminator, a decision-directed Q discriminator, a Q-over-I discriminator, a two-quadrant arctangent discriminator, or a frequency lock loop discriminator.

The controllable oscillators may be implemented by numerical controlled oscillators.

The system may be configured for tracking a Binary Offset Carrier signal, a Multiplexed Binary Offset Carrier signal, a Composite Binary Offset Carrier signal, and/or a Composite Binary Offset Carrier signal using a cosine subcarrier.

A further embodiment of the invention, which corresponds to the first embodiment of the system, relates to a method for tracking a received signal s(t) with at least one subcarrier, wherein the received signal represents a carrier signal modulated with a code signal and modulated with a subcarrier signal, wherein the method comprises the following independently and cooperatively performed acts of:

Tracking the carrier signal with a phase lock loop.

Tracking the subcarrier signal with a subcarrier lock loop, which comprises a controllable oscillator and an early-minus-late discriminator for generating a control signal for the controllable oscillator, wherein the early-minus-late discriminator generates the control signal based on a difference between correlation results with a replica of an advanced subcarrier signal E and a replica of a delayed subcarrier signal L. Alternatively, the subcarrier lock loop comprises a controllable oscillator and an arctan discriminator for generating a control signal for the controllable oscillator, wherein the arctan discriminator generates the control signal based on correlation results with a cosine subcarrier replica and a sine subcarrier replica. It is understood that a code wipe-off has to be performed in both cases.

Tracking the code signal with a delay lock loop, which comprises a controllable oscillator and an arctan discriminator for generating a control signal for the controllable oscillator, wherein the arctan discriminator generates the control signal based on correlation results with a replica of a prompt subcarrier signal P multiplied with a prompt subcarrier signal and the replica of the prompt subcarrier signal P multiplied with the difference of an advanced and a delayed code signal E-L. Instead of prompt subcarrier, also the wording cosine subcarrier could be used.

A yet further embodiment of the invention, which corresponds to the second embodiment of the system, relates to method for tracking a received signal s(t) with at least one subcarrier, wherein the received signal represents a carrier signal modulated with a code signal and modulated with a subcarrier signal, wherein the method comprises the following independently and cooperatively performed acts of:

Tracking the carrier signal with a phase lock loop.

Tracking the subcarrier signal with a subcarrier lock loop, which comprises a controllable oscillator and an early-minus-late discriminator for generating a control signal for the controllable oscillator, wherein the early-minus-late discriminator generates the control signal based on a difference between correlation results with a replica composed of an early subcarrier signal and a prompt code signal EP and a replica composed of a late subcarrier signal and a prompt code signal LP. Alternatively, the subcarrier lock loop comprises a controllable oscillator and an arctan discriminator for generating a control signal for the controllable oscillator, wherein the arctan discriminator generates the control signal based on correlation results with a replica composed of a sine subcarrier signal and a prompt code signal SP and a replica composed of a cosine subcarrier signal and a prompt code signal CP.

Detecting a delay estimate of the code signal with a detection path, which comprises an arctan discriminator and a delay estimate detector, wherein the arctan discriminator generates an input signal for the delay estimate detector based on the correlation results with a replica composed of a prompt subcarrier signal and the difference of an early and a late code signal P(E-L) and a replica composed of a prompt subcarrier signal and a prompt code signal PP.

A further embodiment of the invention relates to a computer program, which implements at least one method according to the invention and as described herein and enables the tracking of a received signal s(t) with at least one subcarrier according to the invention when executed by a computer, which is equipped with means for receiving a signal with at least one subcarrier signals such as an antenna and a RF (Radio Frequency) front end.

According to a further embodiment of the invention, a record carrier storing a computer program according to the invention may be provided, for example a CD-ROM, a DVD, a memory card, a diskette, or a similar data carrier or non-transitory computer readable medium suitable to store the computer program for electronic access and execution of the instructions by a computer processor.

These and other aspects of the invention will be apparent from and elucidated with reference to the embodiments described hereinafter.

The invention will be described in more detail hereinafter with reference to exemplary embodiments. However, the invention is not limited to these exemplary embodiments.

DETAILED DESCRIPTION OF THE PREFERRED EMBODIMENTS

In the following, functionally similar or identical elements may have the same reference numerals. Absolute values are shown below by way of example only and should not be construed as limiting the invention.

As outlined in the background section, the present application relates to tracking a subcarrier modulated signal.

As explained above, the invention exploits the nature of early-minus-late (EML) and arctan discriminators.

An EML discriminator calculates the tracking error from two inputs. For a BPSK signal for example, these inputs would be obtained by correlating the incoming signal after carrier wipe-off with early and late PRN code replicas, respectively. This can be seen as sampling the correlation function at two points, the distance between these points is called early-late spacing.

An EML discriminator provides outputs that can be used to steer the NCO of a tracking loop, as long as the inputs provided stem from sampling a function, which has a maximum at zero tracking error, and decreases with an increasing absolute value of the tracking error, at least as long as the tracking error is small enough.

Figure 3:
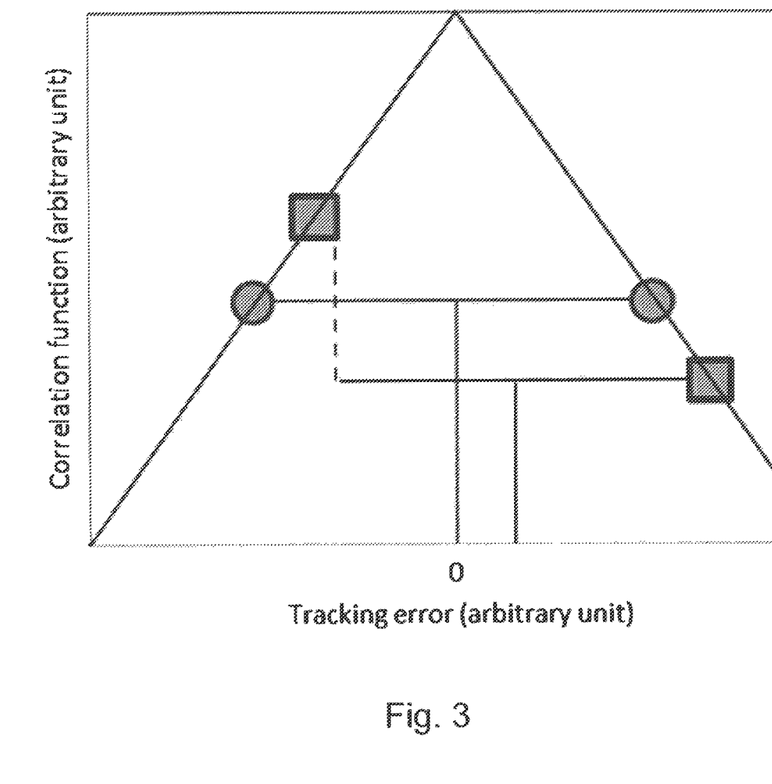
FIG. 3 shows a hypothetical correlation function of an example subcarrier modulated signal, which is sampled at two points with a certain early-late spacing.

This principle is illustrated in FIG. 3. It shows a hypothetical correlation function, which is sampled at two point with a certain early-late spacing. In the case denoted with the circular sampling points, the early and late inputs to the discriminator function have the same value. This is the case if the timing of the incoming signal is known perfectly, because then the early and late replicas for correlation are delayed and advanced, respectively, by exactly the same amount w.r.t the incoming signal. The EML discriminator output will be zero. In case the timing of the incoming signal is not known perfectly, the shift of the early and late replicas is not symmetric to the incoming signal. The sampling of the correlation function will result in two different values, and the EML discriminator will output a quantity that is ideally proportional to the tracking error. This situation is depicted in FIG. 3 with the square sampling points.

An arctan discriminator provides an output that can be used to steer a tracking loop, if the input value provided as numerator for the arctan function is zero for a zero tracking error, and increases (respectively decreases) with increasing (respectively decreasing) tracking error. The input value provided as denominator needs to have its maximum value at zero tracking error, and decreases with an increasing absolute value of the tracking error.

As mentioned previously, the known Double Estimator approach or architecture consists of three independent but cooperative loops for carrier, subcarrier, and code. These loops are called phase lock loop (PLL), subcarrier lock loop (SLL), and delay lock loop (DLL). The Double Estimator uses EML discriminators in the SLL and the DLL, the PLL employs a arctan discriminator. In opposite to that, the Double Phase Estimator uses an EML discriminator for DLL, and arctan discriminators for PLL and SLL. It should be noted that the arctan discriminator needs two real inputs. Due to PLL tracking errors, the correlation results are in general complex. Therefore, in the arctan discriminator either the real parts of the two inputs are calculated and used as numerator and denominator, or the real part of the fraction of the two complex inputs is used, see http://www.insidegnss.com/auto/mayjune15-WP.pdf.

The invention proposes two new tracking structures, which differ from the known Double Estimator and the known Double Phase Estimator in that sense that they use
OPTION1: EML discriminator for SLL, arctan discriminator for DLL
OPTION2: Arctan discriminator for SLL and DLL In order to use an arctan discriminator in the DLL, i.e., for code tracking, the replica for generation of the numerator input contains the difference of a delayed and an advanced PRN code, the replica for generation of the denominator contains a prompt PRN code.

Figure 4:
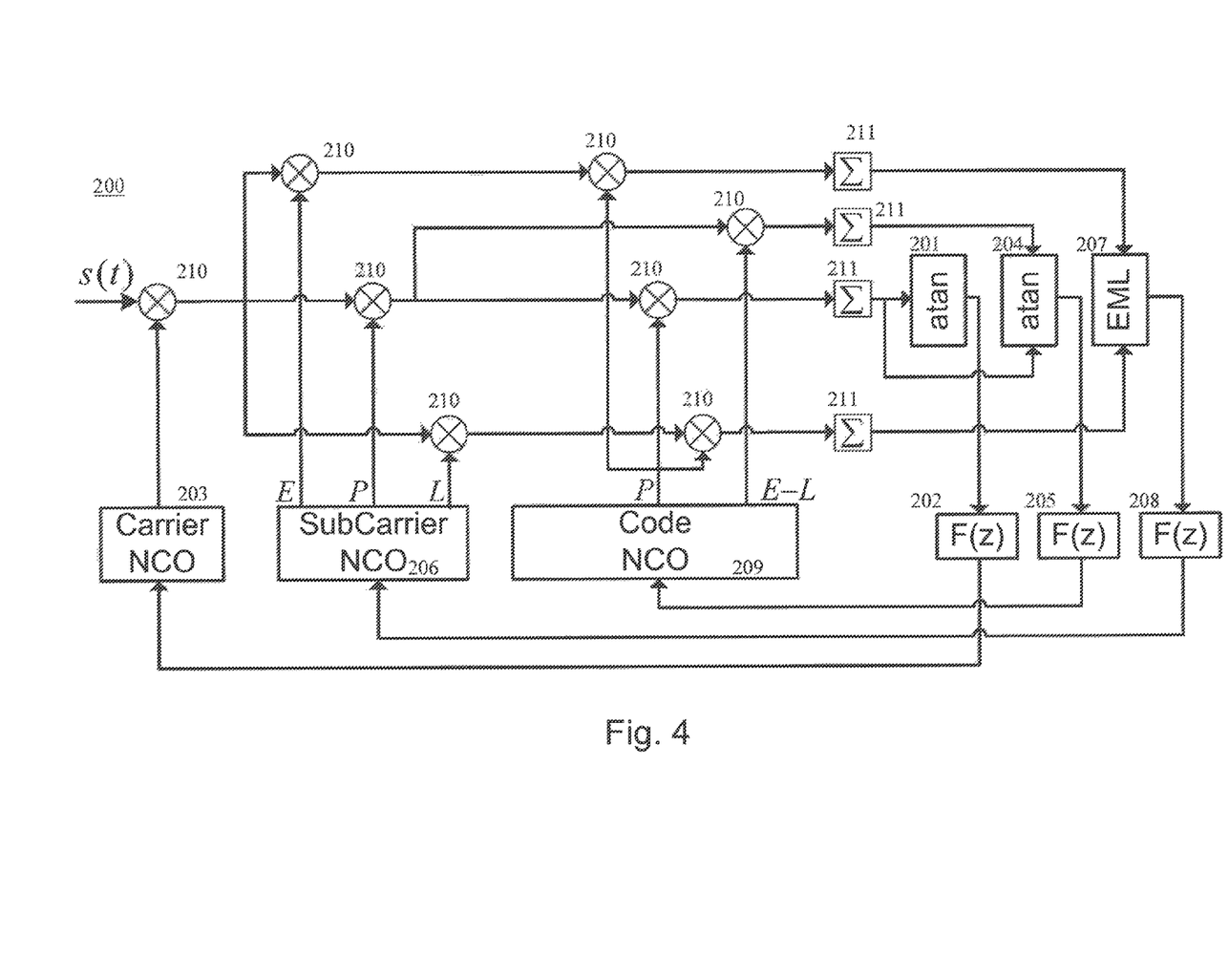
FIG. 4 shows a block diagram of a system for tracking a subcarrier modulated signal according to the invention, which differs from the known Double Estimator and Double Phase Estimator approaches by using an EML discriminator for SLL (Subcarrier Lock Loop) and an arctan discriminator for DLL.
Figure 5:
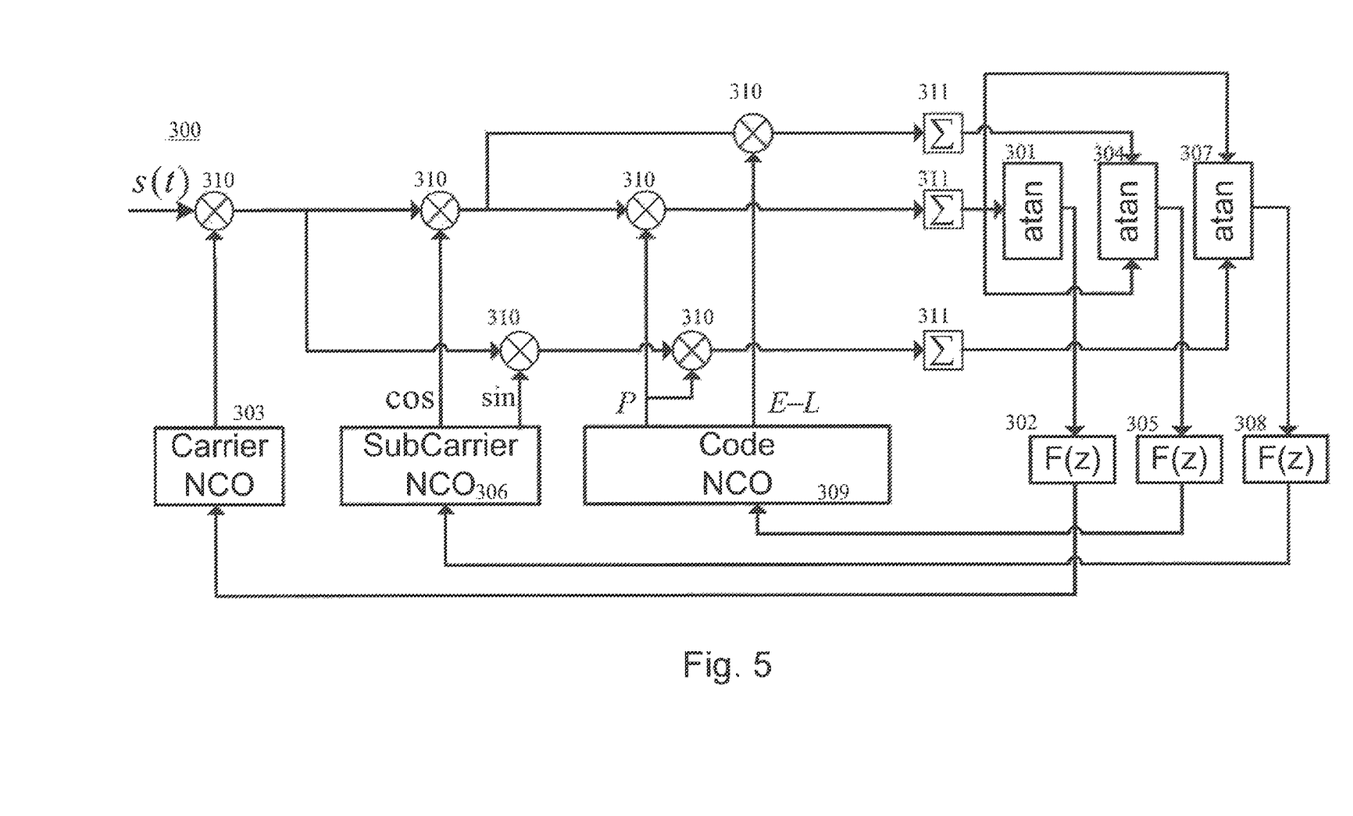
FIG. 5 shows a block diagram of a system for tracking a subcarrier modulated signal according to the invention, which differs from the known Double Estimator and Double Phase Estimator approaches by using an arctan discriminator for SLL and DLL according to the invention.

A block diagram of the tracking architecture according to OPTION1 is shown in FIG. 4, the block diagram for OPTION2 is shown in FIG. 5. The complex inputs to the arctan discriminators are handled in the same way as described in the section above on the Double Phase Estimator.

Next, the inventive tracking architectures shown in FIGS. 4 and 5 are described in detail.

FIGS. 4 and 5 show block diagrams of tracking systems according to OPTION1 (system 200 shown in FIG. 4) and to OPTION2 (system 300 shown in FIG. 5). For sake of simplicity, FIGS. 4 and 5 do not show means for navigation message demodulation and decoding, as well as a RF (radio frequency) front-end and an ADC (analogue-to-digital converter). The signals of FIGS. 4 and 5 are to be understood as complex baseband signals, meaning that the received signal s(t), which represents a carrier signal modulated with a code signal and modulated with a subcarrier signal, is assumed to be down-converted into the baseband. It should be noted, however, that the systems 200 and 300 may operate at intermediate frequencies (IF) or directly at RF in a similar manner.

Both tracking systems 200 and 300 employ three independent, but cooperative feedback loops.

A first loop is used for carrier tracking, i.e., for the locking to the phase and frequency of the carrier signal. The first loop may make use of PLL (phase lock loop) and/or FLL (frequency lock loop) techniques. The first loop of system 200 (300) comprises an arctan discrimination unit 201 (301), a first filter unit 202 (302) and a first oscillator unit 203 (303) (comprising, e.g., a numerically controlled oscillator, NCO).

A second loop is used for subcarrier tracking, i.e., for tracking the subcarrier signal. The second loop of system 200 comprises an early-minus-late discrimination unit 207, a second filter unit 208 and a second oscillator unit 206 (comprising, e.g., a NCO). The second loop of system 300 comprises an arctan discrimination unit 307, a second filter unit 308 and a second oscillator unit 306 (comprising, e.g., a NCO).

A third loop is used for code tracking, i.e., for tracking the code signal. The third loop of system 200 (300) comprises an arctan discrimination unit 204 (304), a third filter unit 205 (305) and a third oscillator unit 209 (309) (comprising, e.g., a NCO). It should be noted that a subcarrier modulated signal may further comprise navigation message data. In the following description, such navigation message bits are ignored, as the presence of navigation bits is not relevant for the principle considerations regarding signal tracking. Furthermore, for the sake of simplicity, the effects of noise, dynamics and multipath on the tracking loop are also not included in the following discussion.

The tracking of a BOC, CBOC and/or MBOC modulated signal may be performed using the three independent but cooperative loops, wherein the first loop is used for tracking the carrier (e.g., based on a PLL or a FLL). The second loop is used for tracking the subcarrier signal (using a SLL). And the third loop is used for tracking the code signal (using a DLL)

The tracking systems 200 and 300 shown in FIGS. 4 and 5, respectively, are designed for tracking subcarrier modulated signals, such as BOC, CBOC and/or MBOC modulated signals. The received signal s(t) may be denoted as $$s(t)=\exp(j\omega t+\phi)\times sc(t-\tau)\times a(t-\tau)$$

wherein $\omega$ is the intermediate (or baseband) frequency, $\phi$ is the unknown phase of the carrier signal, $sc(t-\tau)$ is the subcarrier signal 101 delayed by the transmission delay $\tau$ and $a(t-\tau)$ is the code (also referred to as code signal) delayed by the transmission delay $\tau$.

The system 200 (300) is configured to track the subcarrier signal sc(t) and the code signal a(t). The second loop of system 200 (300) is closed by tracking the subcarrier sc(t) (also referred to as subcarrier signal). The third loop of system 200 (300) is closed by tracking the code a(t) (also referred to as code signal).

In the system 200, the second oscillator unit 206 is configured to generate three replicas of the subcarrier modulated signal, namely an E(arly), P(rompt), and L(ate) replica of the subcarrier modulated signal. The third oscillator unit 209 is configured to generate a P(rompt) PRN code and the difference of an early and a late (E-L) PRN code.

In the system 300, the second oscillator unit 306 is configured to generate a cosine subcarrier modulated signal cos and a sine subcarrier modulated signal sin. The third oscillator unit 309 is configured to generate a P(rompt) PRN code and the difference of an early and a late (E-L) PRN code.

A multiplying unit 210 (310) performs a carrier wipe-off by multiplying the received signal s(t) with output signal of the first oscillator unit 203 (303).

In system 200, further multiplying units 210 multiply the received signal s(t) after carrier wipe-off with the E, P, and L replica of the subcarrier modulated signal. The signal resulting from the multiplication with the P subcarrier replica is further multiplied with a (P)rompt code replica by a further multiplying unit 210, which yields a signal that is, after integrated by an integration unit 211, used for carrier loop closure in the arctan discrimination unit 201, and contributes to code loop closure in the arctan discrimination unit 204. The signal resulting from the multiplication with the P subcarrier replica is also further multiplied with an early-minus-late (E-L) code replica by a further multiplying unit 210, which yields a signal that is, after integrated by an integration unit 211, also contributing to code loop closure in the arctan discrimination unit 204. The signals resulting from the multiplication with the E and L subcarrier replicas are further multiplied with a (P)rompt code replica by a further multiplying unit 210, which yields signals that as, after integrated by an integration unit 211, used for subcarrier loop closure in the EML discrimination unit 207.

In system 300, further multiplying units 310 multiply the received signal s(t) after carrier wipe-off with cosine and sine subcarrier replicas. The two resulting signals are multiplied by a prompt code replica in multiplying units 310, the resulting signals are integrated by an integration unit 311, and are used for carrier loop closure using the arctan discriminator unit 301, for subcarrier loop closure in the arctan discriminator unit 307, and contribute to the code loop closure in the early-minus-late discriminator unit 304. The signal resulting from the multiplication with the cosine replica is further multiplied in the multiplying unit 310 with an (E-L) PRN code, which also contributes, after integration in the integration unit 311, to code loop closure.

Figure 6:
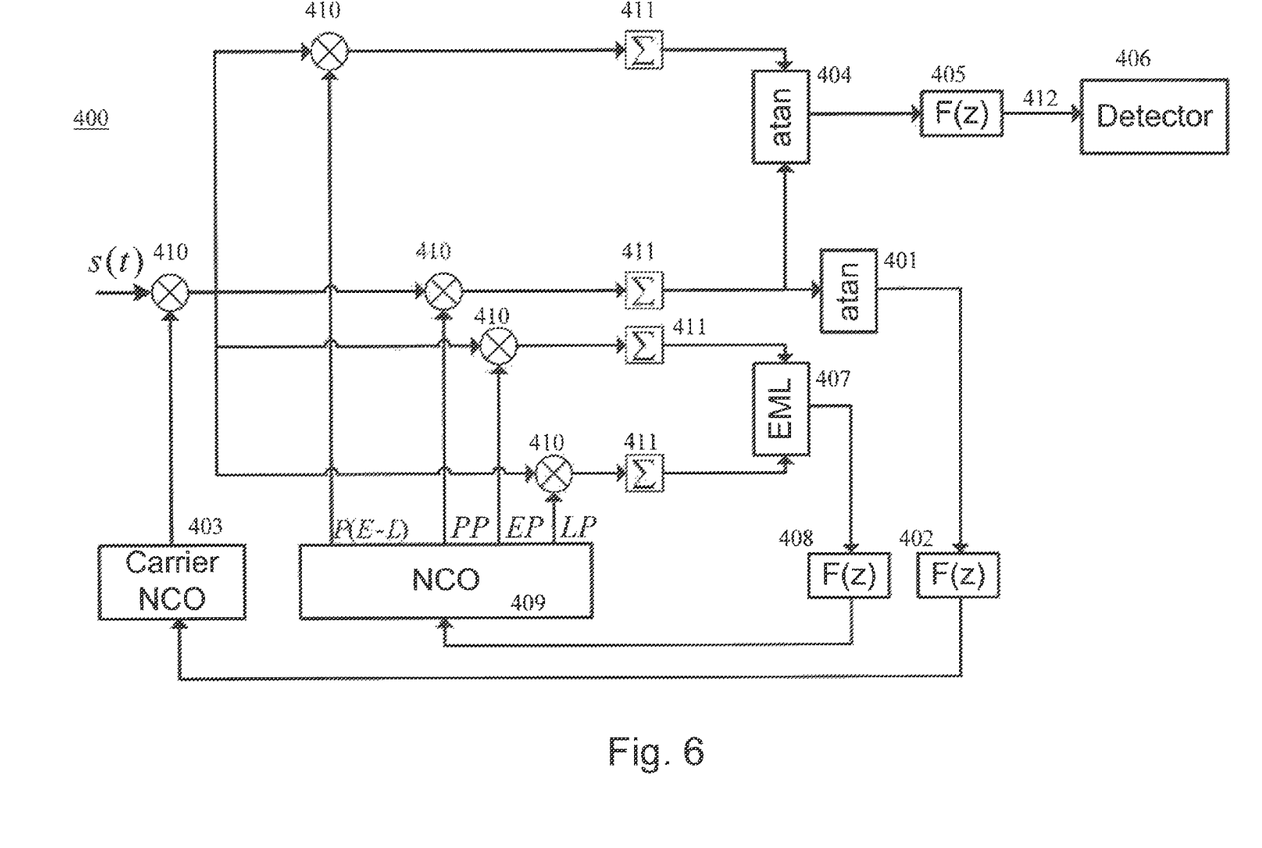
FIG. 6 shows a block diagram of a system for tracking a subcarrier modulated signal according to the invention, which differs from the correlator known from the European patent application EP13290093.7 by using an EML discriminator for SLL and an arctan discriminator for DLL.

In addition, the invention proposes two additional new tracking structures, which differ from the correlator known from the European patent application EP13290093.7 in that sense that they use OPTION3: EML discriminator for SLL, arctan discriminator for DLL OPTION4: arctan discriminator for SLL and DLL The block diagram for OPTION3 is shown in FIG. 6. In this block diagram, PP denotes a replica composed of a prompt subcarrier and a prompt PRN code, EP denotes a replica composed of an early subcarrier and a prompt PRN code, LP denotes a replica composed of a late subcarrier and a prompt PRN code, and code P(E-L) denotes a replica composed of a prompt subcarrier and the difference of an early and a late PRN code.

Figure 7:
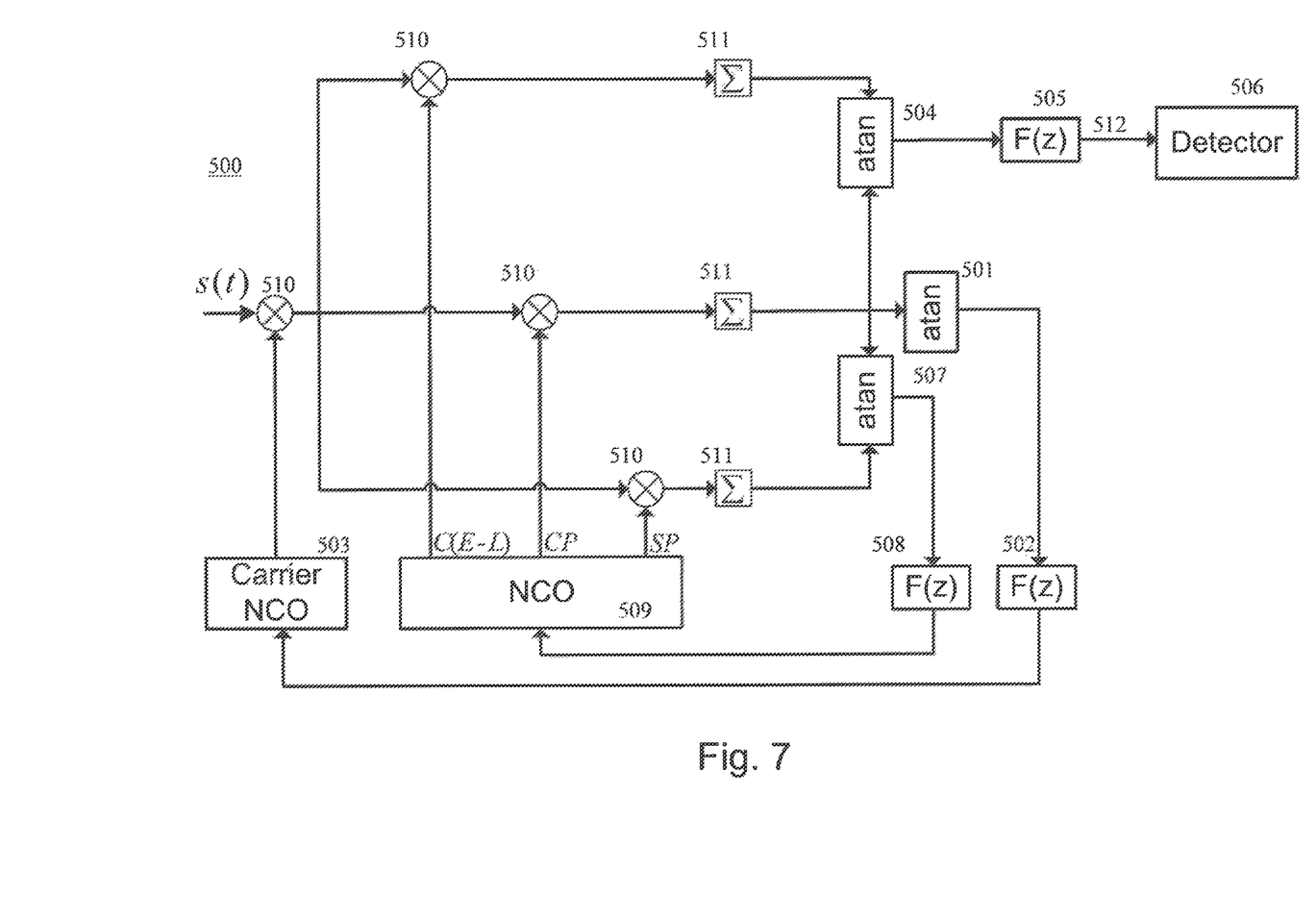
FIG. 7 shows a block diagram of a system for tracking a subcarrier modulated signal according to the invention, which differs from the correlator known from the European patent application EP13290093.7 by using an arctan discriminator for SLL and DLL.

OPTION4 is shown in FIG. 7. In this block diagram, CP denotes a replica composed of a cosine subcarrier and a prompt PRN code, SP denotes a replica composed of a sine subcarrier and a prompt PRN code, and C(E-L) denotes a replica composed of a cosine subcarrier and the difference of an early and a late PRN code. This assignment is valid for BOC cos signals, the modifications required for BOCsin signals are obvious for a person skilled in the art.

Next, the inventive tracking architectures shown in FIGS. 6 and 7 are described in detail. Foundations of the underlying correlator architecture are described in the European patent application EP13290093.7, which is incorporated herein by reference.

FIGS. 6 and 7 show block diagrams of tracking systems according to OPTION3 (system 400 shown in FIG. 6) and to OPTION4 (system 500 shown in FIG. 7). For sake of simplicity, FIGS. 6 and 7 do not show means for navigation message demodulation and decoding, as well as a RF (radio frequency) front-end and an ADC (analogue-to-digital converter). The signals of FIGS. 6 and 7 are to be understood as complex baseband signals, meaning that the received signal s(t), which represents a carrier signal modulated with a code signal and modulated with a subcarrier signal, is assumed to be down-converted into the baseband. It should be noted, however, that the systems 400 and 500 may operate at intermediate frequencies (IF) or directly at RF in a similar manner.

Both tracking systems 400 and 500 employ two independent but cooperative feedback loops.

A first loop is used for carrier tracking, i.e., for the locking to the phase and frequency of the carrier signal. The first loop may make use of PLL (phase lock loop) and/or FLL (frequency lock loop) techniques. The first loop of system 400 (500) comprises an arctan discrimination unit 401 (501), a first filter unit 402 (502) and a first oscillator unit 403 (503) (comprising, e.g., a numerically controlled oscillator, NCO).

A second loop is used for subcarrier racking, i.e., for tracking the subcarrier signal. The second loop of system 400 comprises an EML discrimination unit 407, a second filter unit 408 and a second oscillator unit 409 (comprising, e.g., a NCO). The second loop of system 500 comprises an arctan discrimination unit 507, a second filter unit 508 and a second oscillator unit 509 (comprising, e.g., a NCO). Furthermore, the second loop may be used to produce a disambiguation signal 412 (512) that can be filtered and compared to a threshold in order to detect a false lock to a side peak 115 of the autocorrelation function 103.

It should be noted that a subcarrier modulated signal may further comprise navigation message data. In the following description, such navigation message bits are ignored, as the presence of navigation bits is not relevant for the principle considerations regarding signal tracking. Furthermore, for the sake of simplicity, the effects of noise, dynamics and multipath on the tracking loop are also not included in the following discussion.

The tracking of a BOC, CBOC and/or MBOC modulated signal may be performed using the two independent but cooperative loops, wherein the first loop is used for tracking the carrier (e.g., based on a PLL or a FLL). The second loop is used for tracking the subcarrier signal and the code signal.

The tracking systems 400 and 500 shown in FIGS. 6 and 7, respectively, are designed for tracking subcarrier modulated signals, such as BOC, CBOC and/or MBOC modulated signals. The received signal s(t) may be denoted as $$s(t) = \exp(j\omega t + \phi) \times sc(t-\tau) \times a(t-\tau)$$

wherein $\omega$ is the intermediate (or baseband) frequency, $\phi$ is the unknown phase of the carrier signal, $sc(t-\tau)$ is the subcarrier signal 101 delayed by the transmission delay $\tau$ and $a(t-\tau)$ is the code (also referred to as code signal) delayed by the transmission delay $\tau$. The system 400 (500) is configured to track the transmission delay $\tau$, i.e., to determine an estimate T' of the transmission delay $\tau$. However, instead of performing DLL tracking of the PRN code a(t), the second loop of system 400 (500) is closed by tracking the subcarrier sc(t) (also referred to as subcarrier signal). This may be achieved using the second oscillator unit 409 (509) which is configured to generate, e.g., several replicas of the subcarrier modulated signal.

In the system 400, the second oscillator unit 409 is configured to generate the PP replica composed of a prompt subcarrier and a prompt PRN code, the EP replica composed of an early subcarrier and a prompt PRN code, the LP replica composed of a late subcarrier and a prompt PRN code, and the code P(E-L) replica composed of a prompt subcarrier and the difference of an early and a late PRN code.

In the system 500, the second oscillator unit 509 is configured to generate the CP replica composed of a cosine subcarrier and a prompt PRN code, the SP replica composed of a sine subcarrier and a prompt PRN code, the C(E-L) replica composed of a cosine subcarrier and the difference of an early and a late PRN code.

A multiplying unit 410 (510) performs a carrier wipe-off by multiplying the received signal s(t) with output signal of the first oscillator unit 403 (503).

In system 400, further multiplying units 410 multiply the received signal s(t) after carrier wipe-off with the code P(E-L) replica, the PP replica, the EP replica, and the LP replica. The multiplication with the EP and LP replicas performs a code wipe-off and, then, the code wiped off signals are integrated by integration units 411 and input to the EML discrimination unit 407 to estimate a subcarrier tracking error, which is fed to the filter unit 408 in order to generate a steering command for the second oscillator unit 409. The multiplication with the PP replica performs a subcarrier wipe-off resulting in the subcarrier wiped off signal as output, which is integrated by an integration unit 411 and then input to the arctan discrimination unit 401 for estimating the carrier tracking error, which is fed to the filter unit 408 in order to generate a steering command for the first oscillator unit 403. The subcarrier wiped-off signal multiplied with the code P(E-L) replica is input to the arctan discrimination unit 404, which also receives the integrated carrier signal. The arctan discrimination unit 404 is part of a detection path comprising a filter unit 405 and a detector 406 for determining a delay offset, which is the difference between the locked delay offset and the actual delay offset.

In system 500, further multiplying units 510 multiply the received signal s(t) after carrier wipe-off with the CP replica composed of a cosine subcarrier and a prompt PRN code, the SP replica composed of a sine subcarrier and a prompt PRN code, and the C(E-L) replica composed of a cosine subcarrier and the difference of an early and a late PRN code. The multiplication with the SP replica and the CP replica performs a code wipe-off and, then, the code wiped off signals are integrated by integration unit 511 and input to the arctan discrimination unit 507 to estimate a subcarrier tracking error, which is fed to the filter unit 508 in order to generate a steering command for the second oscillator unit 509. The multiplication with the CP replica performs a code and subcarrier wipe-off resulting in the code and subcarrier wiped off signal as output, which is integrated by an integration unit 511 and then input to the arctan discrimination unit 501 for estimating the carrier tracking error, which is fed to the filter unit 502 in order to generate a steering command for the first oscillator unit 503. The subcarrier wiped-off signal multiplied with the C(E-L) replica is after integration by an integration unit 511 input to the arctan discrimination unit 504, which also receives the integrated carrier signal. The arctan discrimination unit 504 is part of a detection path comprising a filter unit 505 and a detector 506 for determining a delay offset, which is the difference between the locked delay offset and the actual delay offset.

The extension of the inventive and above described tracking structures to CBOC signals is also obvious for persons skilled in the art.

Figure 8:
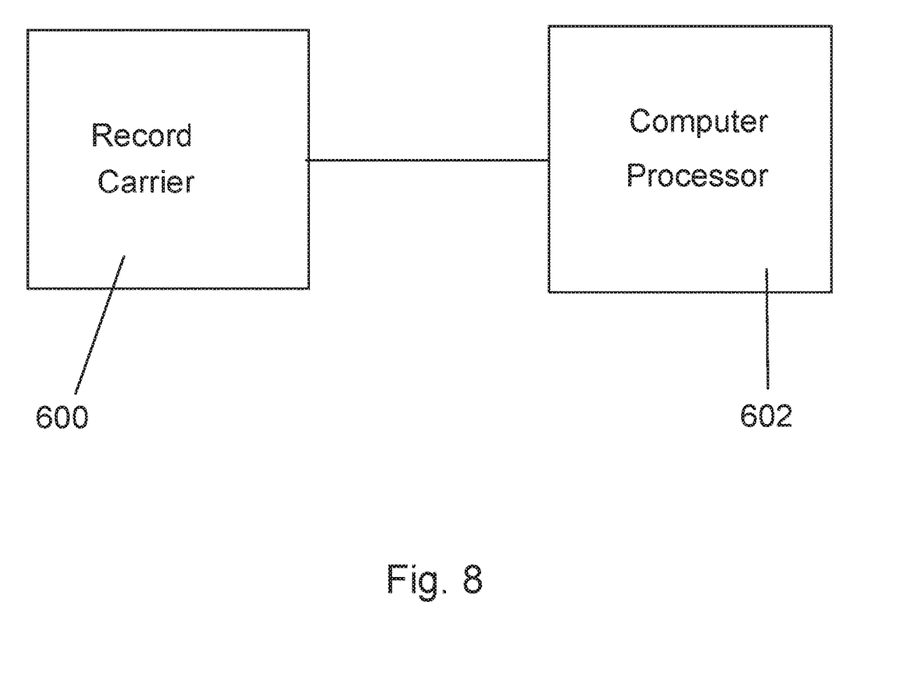
FIG. 8 shows a schematic diagram of a non-transitory computer readable medium connected to a computer processor.

At least some of the functionality of the invention may be performed by hard- or software. In case of an implementation in software, a single or multiple standard microprocessors or microcontrollers may be used to process a single or multiple algorithms implementing the invention. As shown in FIG. 8, a record carrier storing a computer program according to the invention may be provided, for example a CD-ROM, a DVD, a memory card, a diskette, or a similar data carrier or non-transitory computer readable medium 600 suitable to store the computer program for electronic access and execution of the instructions by a computer processor 602. In case of an implementation in hardware, a FPGA (Field Programmable Gate Array) or ASIC (Application Specific Integrated Circuit) may be used.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

REFERENCE NUMERALS AND ACRONYMS 200 first tracking system for a received signal with at least one subcarrier
201 arctan/atan discrimination unit
202 filter unit
203 carrier oscillator unit (NCO)
204 arctan/atan discrimination unit
205 filter unit
206 subcarrier oscillator unit (NCO)
207 early-minus-late discrimination unit
208 filter unit
209 code oscillator unit (NCO)
210 multiplying unit
211 integration unit
300 second tracking system for a received signal with at least one subcarrier
301 arctan/atan discrimination unit
302 filter unit
303 carrier oscillator unit (NCO)
304 arctan/atan discrimination unit
305 filter unit
306 subcarrier oscillator unit (NCO)
307 arctan/atan discrimination unit
308 filter unit
309 code oscillator unit (NCO)
310 multiplying unit
311 integration unit
400 third tracking system for a received signal with at least one subcarrier
401 arctan/atan discrimination unit
402 filter unit
403 carrier oscillator unit (NCO)

404 arctan/atan discrimination unit
405 filter unit
406 detection unit
407 early-minus-late discrimination unit
408 filter unit
409 subcarrier oscillator unit (NCO)
410 multiplying unit
411 integration unit
412 disambiguation signal
500 third tracking system for a received signal with at least one subcarrier
501 arctan/atan discrimination unit
502 filter unit
503 carrier oscillator unit (NCO)
504 arctan/atan discrimination unit
505 filter unit
506 detection unit
507 arctan/atan discrimination unit
508 filter unit
509 subcarrier oscillator unit (NCO)
510 multiplying unit
511 integration unit
512 disambiguation signal
600 non-transitory computer readable medium
602 computer processor
ASIC Application Specific Integrated Circuit
BPSK Binary Phase Shift Keying
BOC Binary Offset Carrier
CBOC Composite BOC
cBOCc Composite BOC using a cosine subcarrier
DLL Delay Lock Loop
EML Early-Minus-Late
FLL Frequency Lock Loop
FPGA Field Programmable Gate Array
GNSS Global Navigation Satellite System
GPS Global Positioning System
MBOC Multiplexed Binary Offset Carrier
NCO Numerical Controlled Oscillator
PLL Phase Lock Loop
PRN Pseudo-Random Noise
SLL Subcarrier Lock Loop

The invention claimed is:

1. A system for tracking of a received signal with at least one subcarrier, wherein the received signal represents a carrier signal modulated with a code signal and modulated with a subcarrier signal, wherein the system comprises the following independent and cooperatively operating loops:
a phase lock loop for tracking the carrier signal;
a subcarrier lock loop for tracking the subcarrier signal, which comprises a first controllable oscillator and one of an early-minus-late discriminator or a first arctan discriminator, for generating a control signal for the first controllable oscillator,
wherein one of
the early-minus-late discriminator generates the control signal based on a difference between correlation results with a replica of an advanced subcarrier signal and a replica of a delayed subcarrier signal, or
the first arctan discriminator generates the control signal based on correlation results with a cosine subcarrier replica and a sine subcarrier replica; and
a delay lock loop for tracking the code signal, which comprises a second controllable oscillator and a second arctan discriminator for generating a control signal for the second controllable oscillator,
wherein one of
the second arctan discriminator generates the control signal based on correlation results with a replica of a prompt subcarrier signal multiplied with a prompt code signal and the replica of the prompt subcarrier signal multiplied with the difference of an advanced code signal and a delayed code signal, or
the second arctan discriminator generates the control signal based on correlation results with the cosine subcarrier replica multiplied with the prompt code signal and the cosine subcarrier replica multiplied with the difference of the advanced code signal and the delayed code signal.

2. The system of claim 1, wherein the early-minus-late discriminator is implemented as one of a dot-product-power discriminator, an early-minus-late-power discriminator, an early-minus-late-envelope discriminator, or a double-delta discriminator.

3. The system of claim 1, wherein the early-minus-late discriminator is implemented as one of a coherent discriminator or a non-coherent discriminator.

4. The system of claim 1, wherein at least one of the arctan discriminators is implemented as one of a Costas discriminator, an IQ-product discriminator, a decision-directed Q discriminator, a Q-over-I discriminator, a two-quadrant arctangent discriminator, or a frequency lock loop discriminator.

5. The system of claim 1, wherein the controllable oscillators are implemented by numerical controlled oscillators.

6. The system of claim 1 being configured for tracking one of a Binary Offset Carrier signal, a Multiplexed Binary Offset Carrier signal, a Composite Binary Offset Carrier signal, or a Composite Binary Offset Carrier signal using a cosine subcarrier.

7. A system for tracking of a received signal with at least one subcarrier, wherein the received signal represents a carrier signal modulated with a code signal and modulated with a subcarrier signal, wherein the system comprises the following independent and cooperatively operating loops:
a phase lock loop for tracking the carrier signal;
a subcarrier lock loop for tracking the subcarrier signal, which comprises a controllable oscillator and one of an early-minus-late discriminator or a first arctan discriminator, for generating a control signal for the controllable oscillator,
wherein one of
the early-minus-late discriminator generates the control signal based on a difference between correlation results with a replica composed of an early subcarrier signal and a prompt code signal and a replica composed of a late subcarrier signal and the prompt code signal, or
the first arctan discriminator generates the control signal based on correlation results with a replica composed of a sine subcarrier signal and a prompt code signal and a replica composed of a cosine subcarrier signal and the prompt code signal; and
a detection path for detecting a delay estimate of the code signal, which comprises a second arctan discriminator and a delay estimate detector, wherein the second arctan discriminator generates an input signal for the delay estimate detector based on correlation results with a replica composed of a prompt subcarrier signal and the difference of an early code signal and a late code signal and a replica composed of the prompt subcarrier signal and the prompt code signal or based on correlation results with a replica composed of a cosine subcarrier signal and the difference of the early code signal and the late code signal and a replica composed of a sine prompt subcarrier signal and the prompt code signal.

8. The system of claim 7, wherein the early-minus-late discriminator is implemented as one of a dot-product-power discriminator, an early-minus-late-power discriminator, an early-minus-late-envelope discriminator, or a double-delta discriminator.

9. The system of claim 7, wherein the early-minus-late discriminator is implemented as one of a coherent discriminator or a non-coherent discriminator.

10. The system of claim 7, wherein at least one of the arctan discriminators is implemented as one of a Costas discriminator, an IQ-product discriminator, a decision-directed Q discriminator, a Q-over-I discriminator, a two-quadrant arctangent discriminator, or a frequency lock loop discriminator.

11. The system of claim 7, wherein the controllable oscillator is implemented by a numerical controlled oscillator.

12. The system of claim 7 being configured for tracking one of a Binary Offset Carrier signal, a Multiplexed Binary Offset Carrier signal, a Composite Binary Offset Carrier signal, or a Composite Binary Offset Carrier signal using a cosine subcarrier.

13. A method for tracking a received signal with at least one subcarrier, wherein the received signal represents a carrier signal modulated with a code signal and modulated with a subcarrier signal, wherein the method comprises the following independently and cooperatively performed acts of:
tracking the carrier signal with a phase lock loop;
tracking the subcarrier signal with a subcarrier lock loop, which comprises a first controllable oscillator and one of an early-minus-late discriminator or a first arctan discriminator, for generating a control signal for the first controllable oscillator,
wherein one of
the early-minus-late discriminator generates the control signal based on a difference between correlation results with a replica of an advanced subcarrier signal and a replica of a delayed subcarrier signal, or
the first arctan discriminator generates the control signal based on correlation results with a cosine subcarrier replica and a sine subcarrier replica; and
tracking the code signal with a delay lock loop, which comprises a second controllable oscillator and a second arctan discriminator for generating a control signal for the second controllable oscillator,
wherein one of
the second arctan discriminator generates the control signal based on correlation results with a replica of a prompt subcarrier signal multiplied with a prompt code signal and the replica of the prompt subcarrier signal multiplied with the difference of an advanced code signal and a delayed code signal, or
the second arctan discriminator generates the control signal based on correlation results with the cosine subcarrier replica multiplied with the prompt code signal and the cosine subcarrier replica multiplied with the difference of the advanced code signal and the delayed code signal.

14. A method for tracking a received signal with at least one subcarrier, wherein the received signal represents a carrier signal modulated with a code signal and modulated with a subcarrier signal, wherein the method comprises the following independently and cooperatively performed acts of:
tracking the carrier signal with a phase lock loop;
tracking the subcarrier signal with a subcarrier lock loop, which comprises a controllable oscillator and one of an early-minus-late discriminator or a first arctan discriminator for, generating a control signal for the controllable oscillator,
wherein one of
the early-minus-late discriminator generates the control signal based on a difference between correlation results with a replica composed of an early subcarrier signal and a prompt code signal and a replica composed of a late subcarrier signal and theft prompt code signal, or
the first arctan discriminator generates the control signal based on correlation results with a replica composed of a sine subcarrier signal and a prompt code signal and a replica composed of a cosine subcarrier signal and the prompt code signal; and
detecting a delay estimate of the code signal with a detection path, which comprises a second arctan discriminator and a delay estimate detector, wherein the second arctan discriminator generates an input signal for the delay estimate detector based on correlation results with a replica composed of a prompt subcarrier signal and the difference of an early code signal and a late code signal and a replica composed of the prompt subcarrier signal and the prompt code signal or based on correlation results with a replica composed of a cosine subcarrier signal and the difference of the early code signal and the late code signal and a replica composed of a sine prompt subcarrier signal and the prompt code signal.

15. A non-transitory computer readable medium storing instructions executable by a computer processor for tracking a received signal with at least one subcarrier, wherein the received signal represents a carrier signal modulated with a code signal and modulated with a subcarrier signal, comprising the following independently and cooperatively performed instructions to:
track, via the processor, the carrier signal with a phase lock loop;
track, via the processor, the subcarrier signal with a subcarrier lock loop, which comprises a first controllable oscillator and one of an early-minus-late discriminator or a first arctan discriminator, for generating a control signal for the first controllable oscillator,
wherein one of
the early-minus-late discriminator generates the control signal based on a difference between correlation results with a replica of an advanced subcarrier signal and a replica of a delayed subcarrier signal, or
the first arctan discriminator generates the control signal based on correlation results with a cosine subcarrier replica and a sine subcarrier replica; and
track, via the processor, the code signal with a delay lock loop, which comprises a second controllable oscillator and a second arctan discriminator for generating a control signal for the second controllable oscillator,
wherein one of
the second arctan discriminator generates the control signal based on correlation results with a replica of a prompt subcarrier signal multiplied with a prompt code signal and the replica of the prompt subcarrier signal multiplied with the difference of an advanced code signal and a delayed code signal, or the second arctan discriminator generates the control signal based on correlation results with the cosine subcarrier replica multiplied with the prompt code signal and the cosine subcarrier replica multiplied with the difference of the advanced code signal and the delayed code signal.

16. A non-transitory computer readable medium storing instructions executable by a computer processor for tracking a received signal with at least one subcarrier, wherein the received signal represents a carrier signal modulated with a code signal and modulated with a subcarrier signal, comprising the following independently and cooperatively performed instructions to:

track, via the processor, the carrier signal with a phase lock loop;

track, via the processor, the subcarrier signal with a subcarrier lock loop, which comprises a controllable oscillator and one of an early-minus-late discriminator or a first arctan discriminator, for generating a control signal for the controllable oscillator, wherein one of the early-minus-late discriminator generates the control signal based on a difference between correlation results with a replica composed of an early subcarrier signal and a prompt code signal and a replica composed of a late subcarrier signal and the prompt code signal, or the first arctan discriminator generates the control signal based on correlation results with a replica composed of a sine subcarrier signal and a prompt code signal and a replica composed of a cosine subcarrier signal and the prompt code signal; and detect, via the processor, a delay estimate of the code signal with a detection path, which comprises a second arctan discriminator and a delay estimate detector, wherein the second arctan discriminator generates an input signal for the delay estimate detector based on correlation results with a replica composed of a prompt subcarrier signal and the difference of an early code signal and a late code signal and a replica composed of the prompt subcarrier signal and the prompt code signal or based on correlation results with a replica composed of a cosine subcarrier signal and the difference of the early code signal and the late code signal and a replica composed of a sine prompt subcarrier signal and the prompt code signal.

* * * * *